United States Patent
Tsuboyama et al.

(10) Patent No.: US 8,080,322 B2
(45) Date of Patent: Dec. 20, 2011

(54) LIGHT EMITTING DEVICE HAVING HIGH LUMINOUS EFFICIENCY AND HIGH STABILITY

(75) Inventors: Akira Tsuboyama, Machida (JP); Kazunori Ueno, Ebina (JP); Takayuki Teshima, Yokohama (JP); Koichi Suzuki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 591 days.

(21) Appl. No.: 11/930,828

(22) Filed: Oct. 31, 2007

(65) Prior Publication Data

US 2008/0100212 A1 May 1, 2008

(30) Foreign Application Priority Data

Nov. 1, 2006  (JP) ................ 2006-297374

(51) Int. Cl.
*B32B 9/00* (2006.01)
*B32B 19/00* (2006.01)

(52) U.S. Cl. ........ 428/690; 428/917; 313/502; 313/503; 313/504

(58) Field of Classification Search .......... 313/498–512; 257/E51.004, 40, E51.044; 428/917, 690–691
See application file for complete search history.

(56) References Cited

U.S. PATENT DOCUMENTS

| | | | |
|---|---|---|---|
| 6,853,013 B2 | 2/2005 | Hirai et al. | 257/103 |
| 6,995,505 B2 | 2/2006 | Kim et al. | 313/503 |
| 7,615,800 B2 * | 11/2009 | Kahen | 257/103 |
| 2002/0034656 A1 * | 3/2002 | Thompson et al. | 428/690 |
| 2004/0119400 A1 * | 6/2004 | Takahashi et al. | 313/504 |
| 2005/0127371 A1 * | 6/2005 | Yamazaki et al. | 257/72 |
| 2006/0014047 A1 * | 1/2006 | Takiguchi et al. | 428/690 |
| 2007/0072001 A1 | 3/2007 | Tsuboyama et al. | 428/690 |
| 2009/0128011 A1 * | 5/2009 | Miyazaki et al. | 313/504 |

FOREIGN PATENT DOCUMENTS

| | | |
|---|---|---|
| JP | 2003-257671 | 9/2003 |
| JP | 2004-335438 | 11/2004 |

OTHER PUBLICATIONS

Coe et al., "Electroluminescence from Single Monolayers of Nanocrystals in Molecular Organic Devices" *Nature*, vol. 420, 800-803 (2002).

Jang et al., "High Quality CdSeS Nanocrystals Synthesized by Facile Single Injection Process and Their Electroluminescence," *Chem. Commun.*, 2964-2965 (2003).

* cited by examiner

*Primary Examiner* — Nimeshkumar Patel
*Assistant Examiner* — Jose M Diaz
(74) *Attorney, Agent, or Firm* — Fitzpatrick, Cella, Harper & Scinto

(57) ABSTRACT

An object of the present invention is to provide a light emitting device having high luminous efficiency and high stability. The light emitting device includes two electrodes and a light emitting layer interposed between the two electrodes, in which the light emitting layer contains luminous nanoparticles, and the luminous nanoparticles each have a particle diameter smaller than a thickness of the light emitting layer, and each include a metal coordination compound having a ligand formed of an organic compound.

1 Claim, 4 Drawing Sheets

LIGHT EMITTING DEVICE HAVING HIGH LUMINOUS EFFICIENCY AND HIGH STABILITY

BACKGROUND OF THE INVENTION

1. Field of the Invention

The present invention relates to a light emitting device, in particular, an organic electroluminescence (EL) device.

2. Description of the Related Art

Applied researches have been vigorously conducted on an organic EL device because of the potential of the device to serve as a light emitting device having high-speed responsiveness and high luminous efficiency.

The light emitting layer of an organic EL device is known to be formed only of a light emitting material or to be formed of a light emitting dopant and a host material. The reason why the light emitting layer is formed of two components, that is, the light emitting dopant and the host material is that the concentration quenching (self-quenching) of the light emitting dopant should be suppressed. In general, when the concentration of the light emitting dopant in a medium is high, energy transfer between molecules of the light emitting dopant is apt to occur, and the molecules form an association body to produce a heat inactivation path, with the result that the emission quantum efficiency of the device reduces. Therefore, the light emitting layer of a conventional organic EL device has been generally formed of a light emitting dopant at a content of about 0.1% to 20% and a host material, and, in an ideal case, the light emitting dopant must be dispersed in the host material at a molecular level.

An organic EL device using a phosphorescent dopant as a light emitting dopant has been attracting attention in recent years because the device can stably emit light with high efficiency. A metal coordination compound using any one of various metals as a center metal is used as the phosphorescent dopant.

In addition, organic EL devices using nanoparticles as light emitting centers have been announced. Those devices are classified into a device using nanoparticles each made of an inorganic light emitting material such as CdSe or CdSeS (S. Coe et al., "Nature" 2002, 420, p. 800, and E. Jang et al., "Chemical Communications" 2003, p. 2964-2965) and a device using metal oxide nanoparticles or metal nanoparticles none of which is a light emitting material (Japanese Patent Application Laid-Open No. 2004-335438 and Japanese Patent Application Laid-Open No. 2003-257671).

The idea on which each of the devices using nanoparticles each made of an inorganic light emitting material described in S. Coe et al., "Nature" 2002, 420, p. 800, and E. Jang et al., "Chemical Communications" 2003, p. 2964-2965 is based is interesting, but the external quantum efficiency of each of the devices is remarkably as low as 1% or less.

SUMMARY OF THE INVENTION

An object of the present invention is to provide a light emitting device having high luminous efficiency and high stability.

The light emitting device of the present invention includes two electrodes and a light emitting layer interposed between the two electrodes, in which the light emitting layer contains luminous nanoparticles; and the luminous nanoparticles each have a particle diameter smaller than a thickness of the light emitting layer; and are each include a metal coordination compound having a ligand formed of an organic compound.

The light emitting device of the present invention has luminous nanoparticles each formed of a metal coordination compound and each having a particle diameter smaller than the thickness of the light emitting layer of the device as a light emitting center, whereby high luminous efficiency and stable light emission can be obtained.

Further features of the present invention will become apparent from the following description of exemplary embodiments with reference to the attached drawings.

DESCRIPTION OF THE EMBODIMENTS

Hereinafter, the present invention will be described in detail.

Figure 1A:
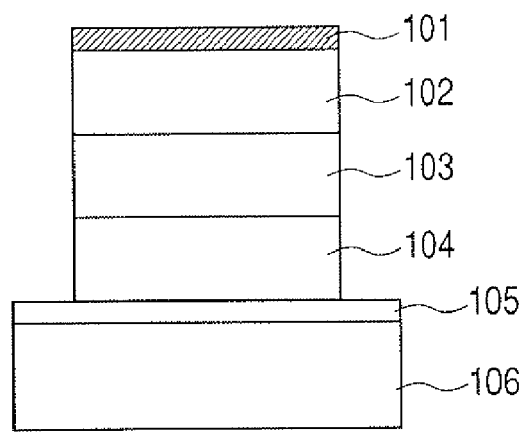
FIGS. 1A, 1B, and 1C are each a schematic sectional view showing an example of the constitution of a light emitting device of the present invention.
Figure 1B:
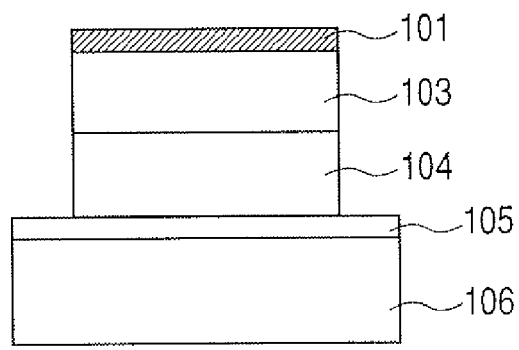
Figure 1C:
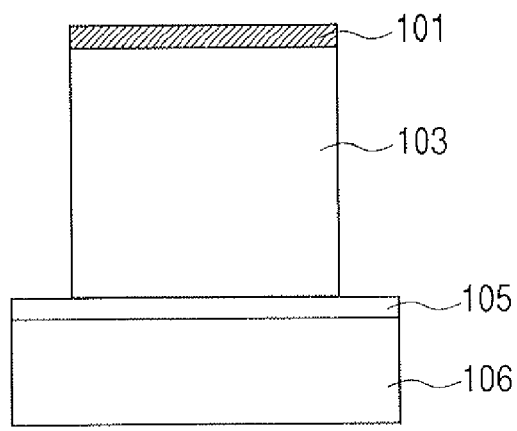

A light emitting device of the present invention has at least a light emitting layer between two electrodes. FIGS. 1A to 1C each show an example of the device. As shown in each of FIGS. 1A to 1C, the device has one or more organic layers including a light emitting layer 103, and the one or more organic layers are interposed between two electrodes (an anode 105 and a cathode 101). An electron injecting layer or a hole injecting layer is provided at an interface between the cathode 101 or the anode 105 in some cases. Reference numeral 102 represents an electron transporting layer; 104, a hole transporting layer; and 106, a glass substrate.

The light emitting layer 103 contains luminous nanoparticles.

The luminous nanoparticles each have a particle diameter smaller than the thickness of the light emitting layer 103. To be specific, the light emitting layer 103 has a thickness of preferably 50 nm or more to 500 nm or less, and the luminous nanoparticles each have a particle diameter of preferably 25 nm or more to 250 nm or less.

In addition, the luminous nanoparticles are each formed of a metal coordination compound having a ligand formed of an organic compound. Preferable examples of the metal coordination compound are shown below. However, the compound is not limited to these examples.

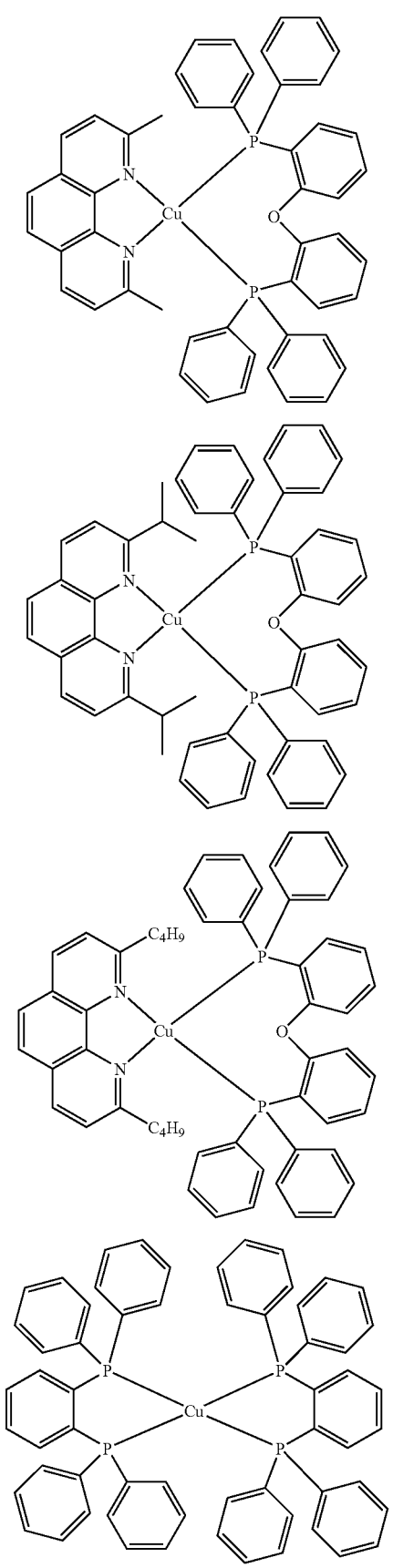
2001
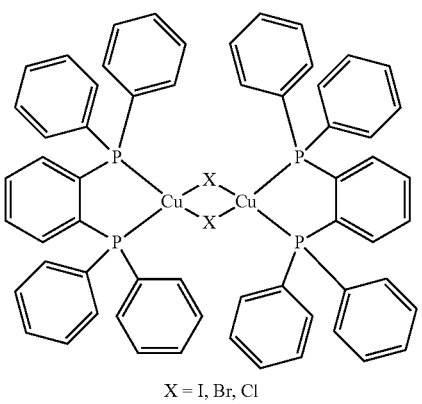
X = I, Br, Cl
2002
2006
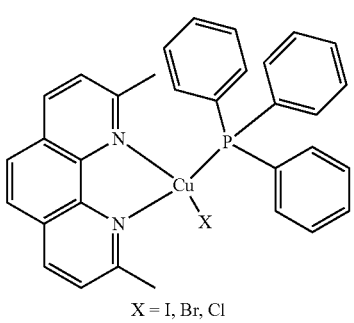
X = I, Br, Cl
2003
2007
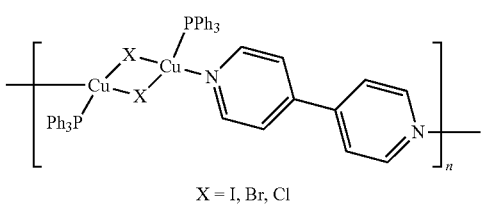
X = I, Br, Cl
2008
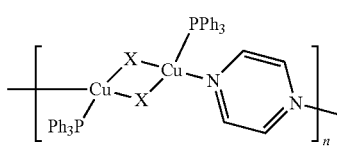
X = I, Br, Cl
2004
3001
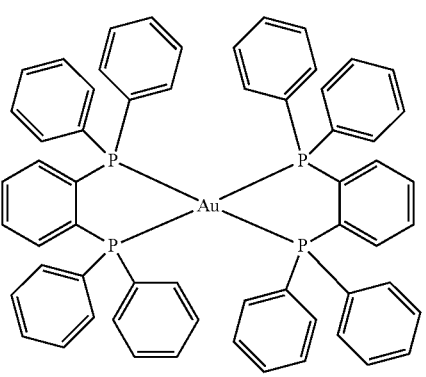

3002
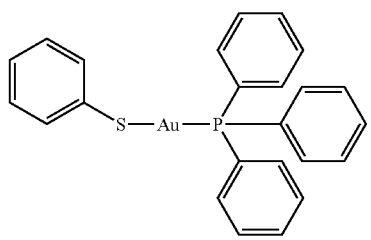
3003
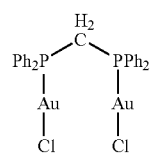
3011
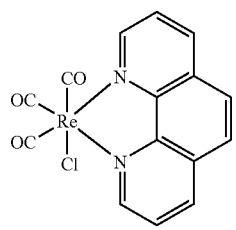
3012
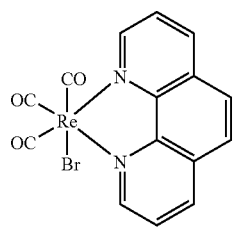
3013
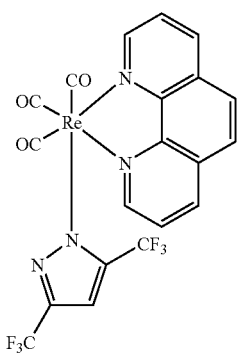
4001
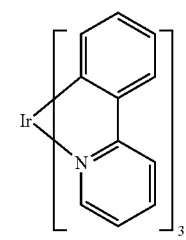
4002
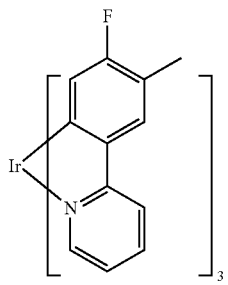
4003
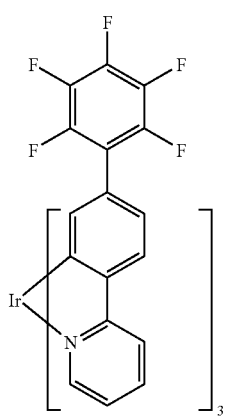
4004
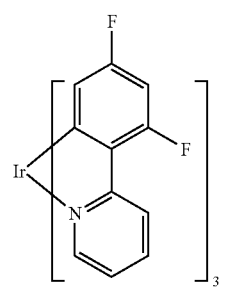
4005
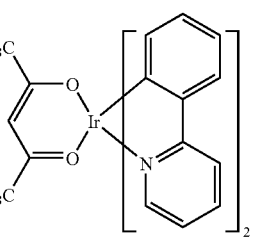
4006
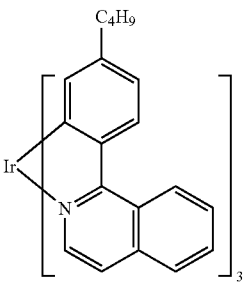

-continued

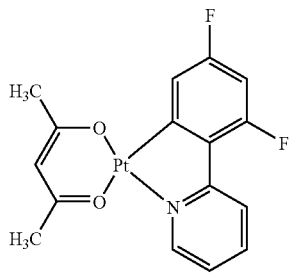

4011

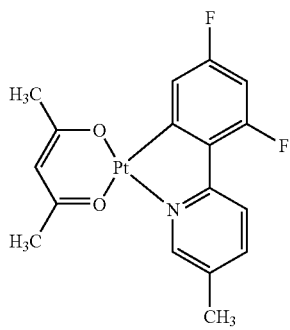

4012

Metal coordination compounds each having Cu (2001 to 2008), Au (3001 to 3003), Re (3011 to 3013), Ir (4001 to 4006), or Pt (4011 and 4012) as a center metal are shown. The emission spectrum of light emitted from a solution of each of those complexes in, for example, an organic solvent or from each of the complexes in a crystalline state can be observed. Each of those metal complexes is observed to emit strong phosphorescence at room temperature by virtue of a heavy-atom effect because the center metal of each of the metal complexes has a large atomic number.

In the present invention, the nanoparticles of each of those metal coordination compounds in a crystalline state, a microcrystalline state, or an amorphous/crystal mixed state are used. A metal coordination compound that strongly emits light in a single solid state or a crystalline state is a desirable light emitting material suitable for nanoparticles. Each of the above-mentioned coordination compounds having Cu, Au, or Re as a center metal often emits stronger light in a single solid state than in a solution state. Light emitted from each of those metal coordination compounds has the following characteristics: in many cases, light emitted from each of the compounds in a solid state has a longer emission lifetime than that of light emitted from each of the compounds in a solution state, and the emission spectrum of the light emitted from each of the compounds in a solid state has a shorter wavelength than that of the emission spectrum of the light emitted from each of the compounds in a solution state. Although the reason for the foregoing is unclear, the reason is considered to be as follows: the crystalline structure of each of the compounds in a solid state advantageously acts on the light emission of the compound, and each of the compounds emits stronger light than light emitted from each of the compounds in a state of being dispersed at a monomolecular level like the compound in a solution. In addition, an Ir or Pt coordination compound typically emits stronger light in a solution than in a solid state. However, when a relatively large substituent such as a fluorine atom or an alkyl group is given to the Ir or Pt coordination compound as described above, the compound emits strong light even in a single solid state, whereby the compound becomes a luminous metal coordination compound suitable for the light emitting device of the present invention.

Exemplified Compounds 2007 and 2008 are each an example of a metal coordination polymer compound. In this example, a copper ion is crosslinked with a halogen, 4,4'-bipyridine, and pyrazine and turned into a polymer. The metal coordination compound emits extremely strong light in a solid state.

The light emitting layer 103 preferably further contains a host compound. Examples of the host material are shown below.

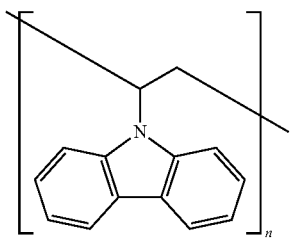

5001

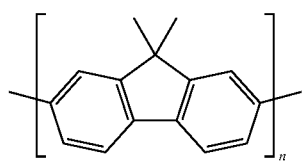

5002

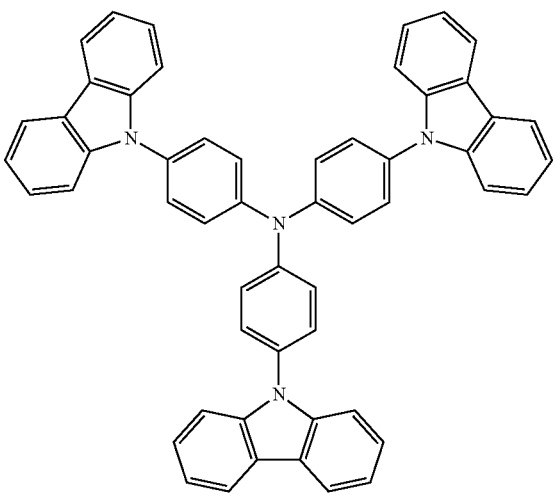

5003

-continued

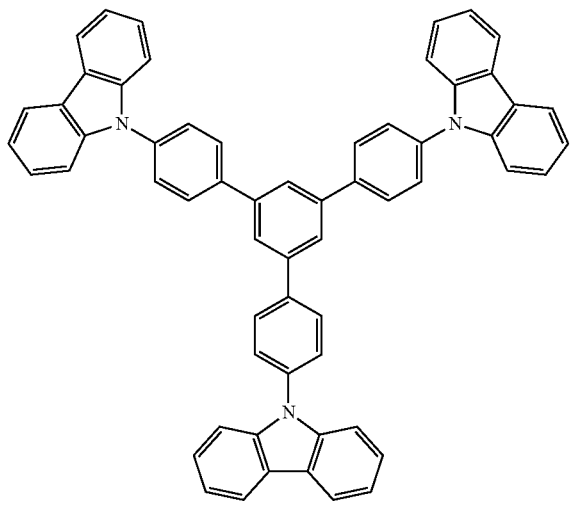

5004

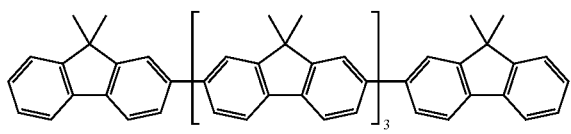

5005

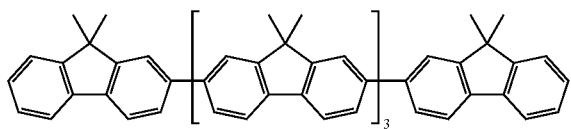

5006

The host material transports carriers, that is, an electron and a hole, whereby a molecule in each of the nanoparticles is excited to emit light. At that time, it is important that carrier transfer or energy transfer from the host to each of the nanoparticles should be smoothly performed. Since each of the host material and a ligand of the metal coordination compound is formed of an organic compound rich in—electrons, the transfer of a carrier such as an electron or a hole, or the transfer of excitation energy from the host material to each of the nanoparticles is smooth, and hence a light emitting device having high luminous efficiency can be realized.

In addition, an "amorphous state" is generally considered to be essential for an organic layer of an organic EL device. The reasons for the foregoing are as follows: (1) when the organic layer is in the amorphous state, the organic layer can be formed into a high-quality organic layer having a thickness of about 50 nm to 200 nm; and (2) high carrier conductivity can be imparted to the organic layer. In the amorphous state, unlike in a microcrystalline state, no carrier is trapped at a crystal interface, and a carrier can easily flow. However, the "amorphous state" is a thermally metastable state, and cannot always be said to be structurally stable. In particular, a light emitting center desirably has a strong structure resistant to deterioration because the center must repeat a transition between an excited state and a ground state.

Stable light emission can be expected by the introduction of nanoparticles each in a crystalline state or a microcrystalline state into the light emitting layer as in the present invention. When the light emitting layer contains a host material, the host material forms an amorphous state, whereby a carrier can be effectively flowed at the time of the application of an electric field. On the other hand, the nanoparticles each serving as a light emitting center are each in a thermally stable crystalline or microcrystalline state, so light emission occurs in a crystal field. The foregoing leads the advantage that light can be stably emitted while the extent to which the light deteriorates is suppressed.

A method of producing the organic layers including the light emitting layer 103 is, for example, a method involving forming a solution of a material for each of the organic layers into a coating film such as a spin coating method, an ink-jet method, a printing method and a spray method.

A method of producing the nanoparticles is not particularly limited. A method of producing fine particles is, for example, a "dry grinding method" or a "wet grinding method". Each of those methods is a method of producing particles by grinding a large particle into small pieces. Therefore, a preferable method of producing uniform nanoparticles includes: supplying each of two liquids containing a precursor or raw material for the nanoparticles from a flow path; and mixing the liquids to produce the nanoparticles. Here, the method will be described.

A microreactor is a chemical device which: is a small, three-dimensional structure used for performing a reaction or mixing; and utilizes a phenomenon in a micro space. The microreactor is generally a generic name for a reactor or mixer having multiple microscale flow paths, and is detailed in, for example, the following document:

"Microreactors New Technology for Modern Chemistry" (by Wolfgang Ehrfeld, Volker Hessel, and Holger Loewe, WILEY-VCH, published in 2000).

In the present invention, for example, a microreactor 1 having microscale flow paths shown in each of FIGS. 2 to 5 can be used as the microreactor. However, the shape and structure of the microreactor to be used in the present invention are not limited to the foregoing.

Figure 2:
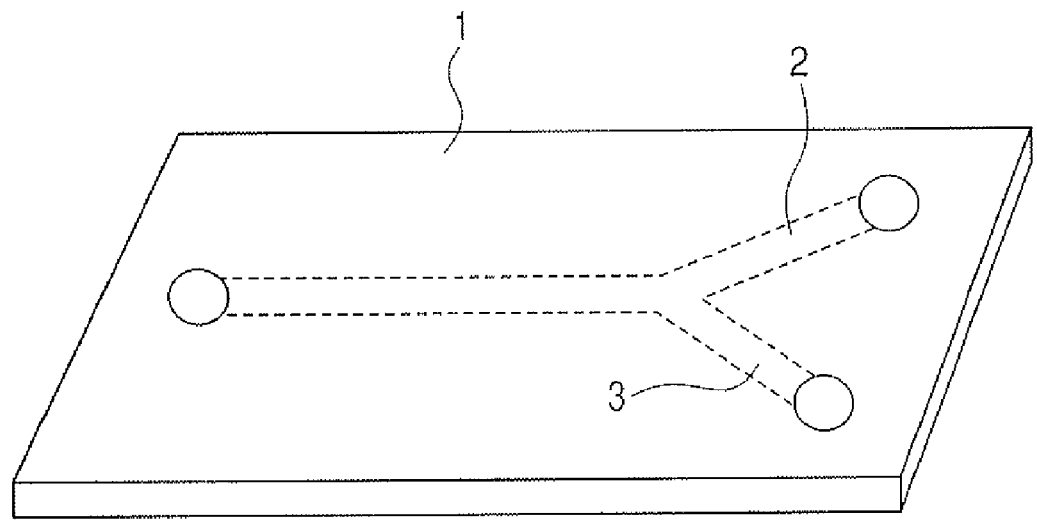
FIG. 2 is a view for illustrating an example of a microreactor for synthesizing a luminous nanoparticle.
Figure 3:
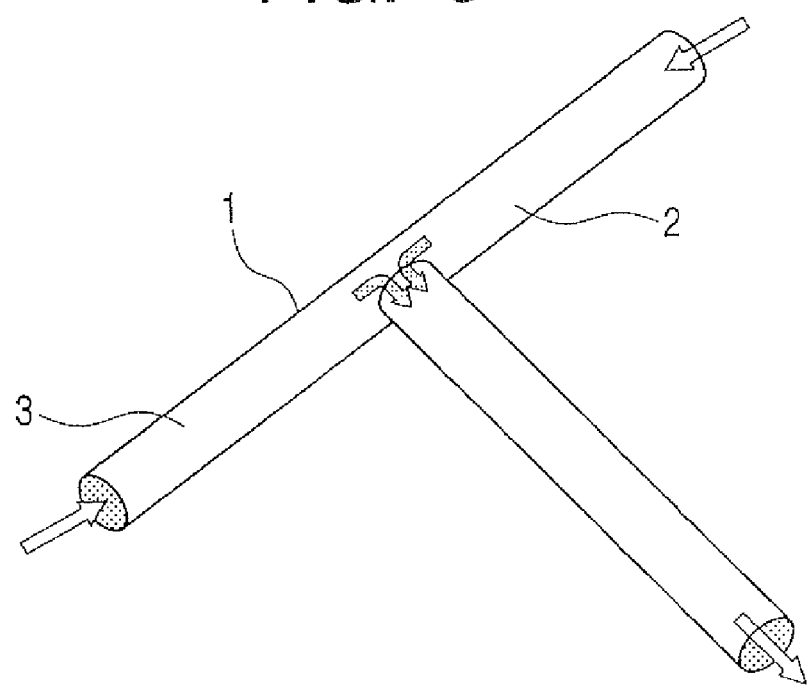
FIG. 3 is a view for illustrating another example of the microreactor for synthesizing a luminous nanoparticle.

FIGS. 2 and 3 show microreactors having different shapes. However, each of the microreactors has a first flow path 2 and a second flow path 3, two liquids needed for the production of nanoparticles are flowed through these flow paths, and the liquids mix with each other at the position where the flow paths join with each other, whereby nanoparticles are produced.

For example, a commercially available microreactor manufactured by Institute fur Mikrotechnik Mianz (IMM) may be used. Each of the flow paths of the microreactor to be used in the present invention is a microscale flow path having a flow path width of several micrometers to several hundreds of micrometers or several thousands of micrometers. In other words, each of the flow paths has small dimensions, and the flow rate of a fluid flowing in each of the flow paths is small, so the Reynolds number of the fluid is small.

A turbulent flow or a laminar flow can be made dominant in a fluid flowing in a microscale flow path by designing the diameter and shape of the flow path. Each of a turbulent flow and a laminar flow can be utilized in the present invention. In the case where a laminar flow is dominant, even when the flows of two liquids are brought into contact with each other, the diffusion of the liquids through an interface between the liquids becomes dominant.

For example, a microscale space is said to be extremely advantageous for the diffusion and mixing of two liquids at an interface where the laminar flows of the two liquids contact with each other because the microscale space has a large surface area per unit volume. In addition, according to Fick's law, the time required for the mixing of the liquids is proportional to the square of a distance along which the liquids diffuse. That is, the mixing of the liquids by the diffusion of the molecules of the liquids is completed within a shorter mixing time as the width of a flow path through which each of the liquids is flowed is made smaller. To be specific, when the flow path width is decreased by a factor of ten, the mixing time is decreased by a factor of 100. Therefore, the flow path width is preferably smaller than 1,000 μm, preferably 500 μm or less, preferably 200 μm or less, or preferably 100 μm or less.

A material to be used in each of the flow paths of the microreactor of the present invention is, for example, a metal, glass, silicon, Teflon (registered trademark), ceramic, or a plastic. When heat resistance, pressure resistance, and solvent resistance are requested of each of the flow paths, a metal, glass, silicon, Teflon (registered trademark), or ceramic is used. A metal is preferable. Examples of the metal include stainless steel, hastelloy (Ni—Fe-based alloy), nickel, gold, platinum, and tantalum. However, a metal material for each of the flow paths of the microreactor to be used in the present invention is not limited to the foregoing.

In addition, the surface of each of the flow paths may be subjected to a lining treatment in order that the flow path may obtain corrosion resistance and desired surface energy.

In a microscale space, molecules are quickly transported, caused to react with each other, and separated from each other only by the spontaneous behavior of each of the molecules without the use of, for example, mechanical stirring. Therefore, the rate of a reaction under the laminar flow of a microreactor is generally said to be higher than that of a reaction under a turbulent flow in the case where a conventional macro reactor is used. Further, two liquids always contact with each other at the same interval to form a laminar flow, whereby the mixing of, or a reaction between, the liquids progresses. As a result, the uniformity of the mixed liquid or the order of the reaction between the liquids can be maintained. For example, when a reaction for producing fine particles is performed by utilizing a microreactor, the reaction instantaneously progresses, a large number of cores are produced, and a large number of particles grow on the basis of the production, whereby fine particles each having a small primary particle diameter are formed. Accordingly, the fine particles of a functional substance each having a small primary particle diameter can be obtained by synthesizing, precipitating, or crystallizing the functional substance with the microreactor. In addition, the particle size distribution of the particles can be narrowed because the reaction has order.

In addition, placing microreactors in parallel (numbering-up) can correspond to the mass production of a product in which the functional substance is dispersed depending on a needed quantity of production.

Figure 4:
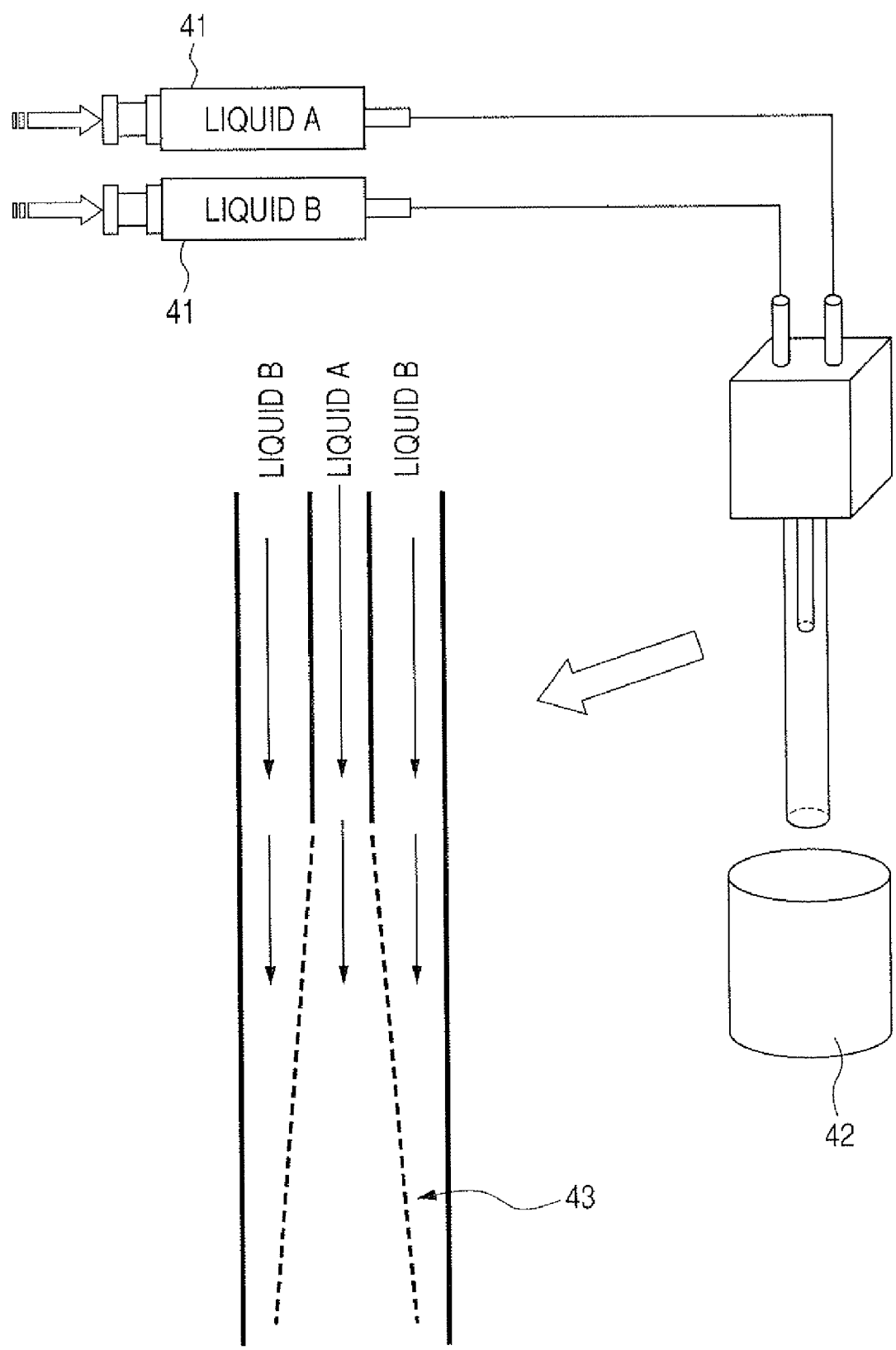
FIG. 4 is a view for illustrating another example of the microreactor for synthesizing a luminous nanoparticle.

Reaction liquids A and B for producing a metal coordination compound are prepared in advance in order that nanoparticles to be used in the present invention may be produced. Separately, as shown in FIG. 4, two pipes having different diameters are set to enter each other. Reference numeral 41 represents a syringe; 42, a beaker; and 43, a reaction interface. In FIG. 4, for example, the diameter of a pipe through which the liquid A is flowed is 1 mm, the diameter of a pipe through which the liquid B is flowed is 3 mm, and each of the liquid A and the liquid B is flowed at a constant flow rate. The liquids A and B rapidly react with each other at the reaction interface, whereby a desired metal complex is produced. The particle diameter of each of the produced particles can be identified by: collecting the resultant liquid in a container; and measuring the particle diameter of each of the particles in the liquid with a particle diameter measuring device DLS-7000 (manufactured by OTSUKA ELECTRONICS CO., LTD.).

EXAMPLE 1

Exemplified Compound 2001 was produced according to the following reaction formulae.

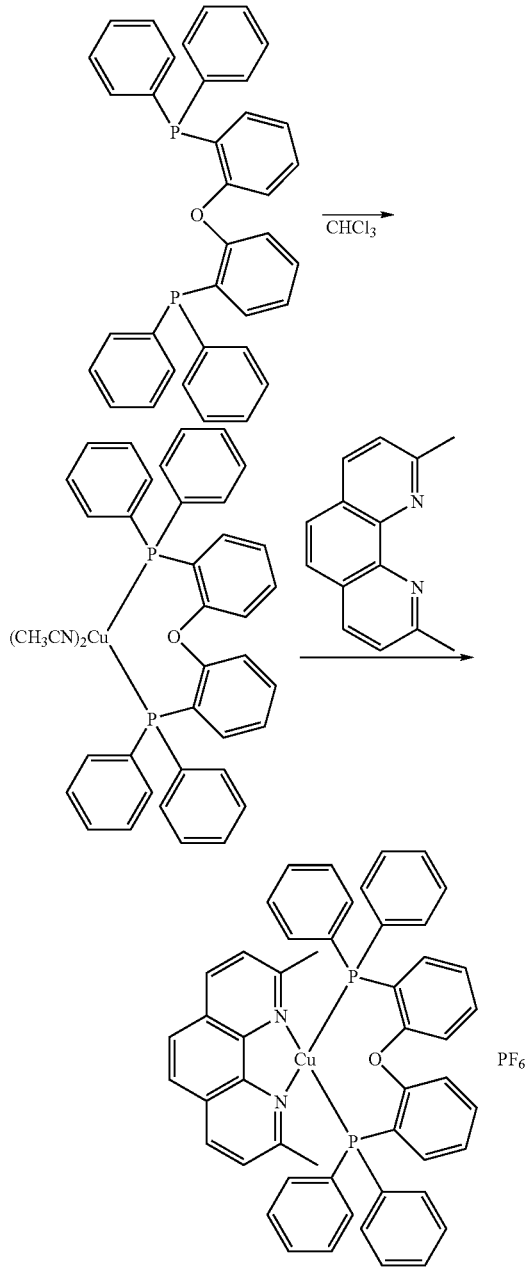

Exemplified Compound 2001 produced according to the above reaction formulae was dissolved in chloroform, and the solution was defined as a liquid A. The concentration of the liquid A was such that chloroform was added in an amount corresponding to 20% in volume ratio to a saturated solution. In addition, hexane to be used as a poor solvent for the metal coordination compound was defined as a liquid B. The liquid A and the liquid B as a poor solvent are mixed with each other, whereby Exemplified Compound 2001 is reprecipitated in a microreactor, and a reaction abruptly progresses. As a result, nanolevel fine particles are produced.

Figure 5:
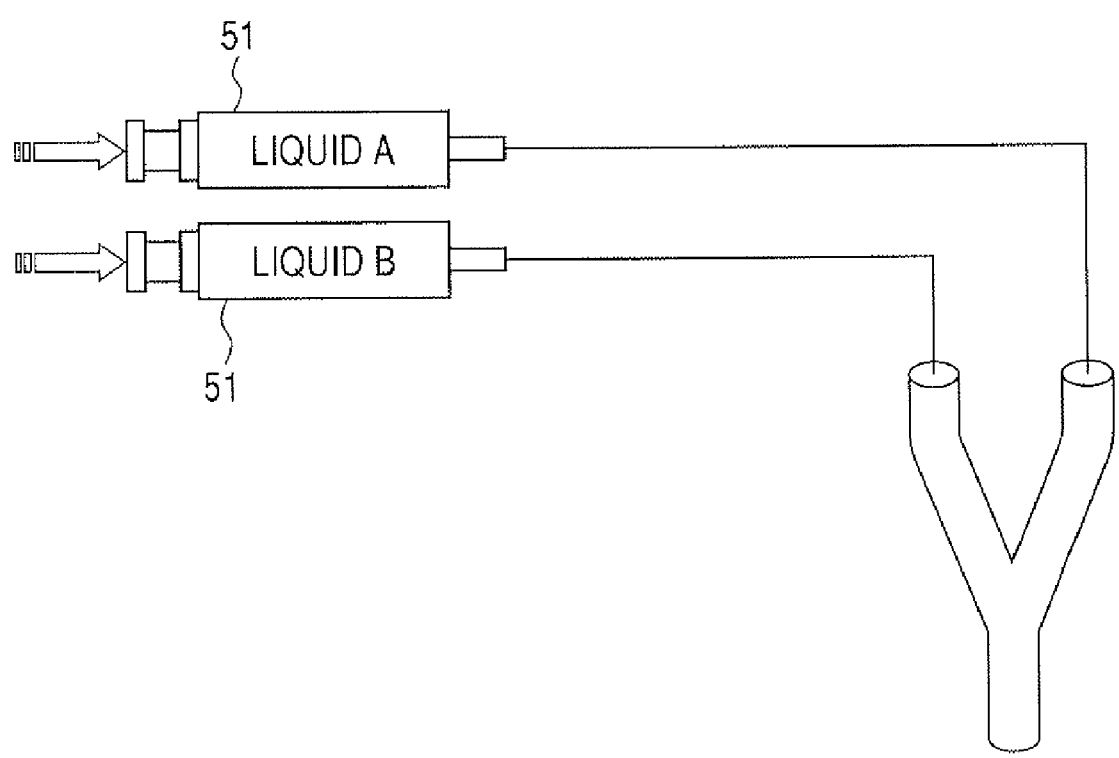
FIG. 5 is a view for illustrating another example of the microreactor for synthesizing a luminous nanoparticle.

As shown in FIG. 5, the nanoparticles of Exemplified Compound 2001 were synthesized by flowing the liquid A and the liquid B through a microreactor synthesizing device. Reference numeral 51 represents a syringe. The liquid A and the liquid B were flowed at flow rates of 0.3 ml/min and 30 ml/min, respectively. The particle diameter of each of the nanoparticles was measured with a dynamic light scattering photometer DLS-7000 (manufactured by OTSUKA ELECTRONICS CO., LTD.) As a result, the nanoparticles were identified as nanoparticles each having a central particle diameter of 50 nm or more to 70 nm or less.

An organic EL device having three organic layers shown in FIG. 1A was produced by using each of the above nanoparticles as a light emitting center.

ITO (the anode 105) having a thickness of 100 nm was patterned onto the glass substrate 106 (transparent substrate) so that an electrode area would be 3.14 mm$^2$.

PEDOT (for an organic EL) manufactured by Bayer was applied onto the ITO substrate by spin coating at 1,000 rpm (20 seconds) to have a thickness of 40 nm. The applied layer was dried in a vacuum chamber at 120° C. for 1 hour, whereby the hole transporting layer 104 was formed.

The following solution was applied onto the layer by spin coating under a nitrogen atmosphere at 2,000 rpm for 20 seconds, whereby an organic film (the light emitting layer 103) having a thickness of 120 nm was formed. After the formation of the film, the film was dried under the same conditions as those at the time of the formation of the hole transporting layer 104.

| | |
|---|---|
| Toluene: | 10 g |
| Polyvinyl carbazole (Exemplified Compound 5001: average molecular weight 9,600): | 92 mg |
| Nanoparticles (Exemplified Compound 2001): | 8 mg |

The substrate was mounted in a vacuum vapor deposition chamber, and Bphen was formed into a film having a thickness of 40 nm by vacuum vapor deposition (the electron transporting layer 102).

The total thickness of the organic layers is 130 nm.

Next, the cathode 101 having such constitution as described below was formed.
Metal electrode layer 1 (15 nm): AlLi alloy (Li content 1.8 mass %)
Metal electrode layer 2 (100 nm): Al After the completion of the formation of the films, the device was taken out and evaluated.

The device was evaluated for device characteristics by applying a DC voltage while defining the cathode 101 as a negative electrode and the anode 105 as a positive electrode.

The voltage-current characteristics of the device showed a good rectifying property. The emission spectrum and emission luminance of the device were measured with spectrum measuring machines SR1 and BM7 manufactured by TOPCON CORPORATION. The current value of the device at the time of the application of the voltage was measured with a 4140Bd manufactured by Hewlett-Packard Company. The resultant EL light emission was green light emission (emission peak wavelength=535 nm), and its external emission quantum efficiency was 5.5%. This means that high efficiency was obtained. The maximum luminance of the EL light emission was 1,200 cd/cm$^2$. This means that high luminance was realized. In addition, at a luminance of 100 cd/cm$^2$, the EL light emission was stably good, and remained good even after energization for 10 hours.

EXAMPLE 2

An organic EL device was produced in the same manner as in Example 1 except that Exemplified Compound 4003 was used as a metal coordination compound, and the device was evaluated in the same manner as in Example 1.

The external emission quantum efficiency of the resultant EL light emission was 5.5%. This means that high efficiency was obtained. The maximum luminance of the EL light emission was 950 cd/cm$^2$. This means that high luminance was realized. In addition, at a luminance of 100 cd/cm$^2$, the EL light emission was stably good, and remained good even after energization for 10 hours.

EXAMPLE 3

An organic EL device having two organic layers shown in FIG. 1B was produced.

Steps up to the formation of the hole transporting layer 104 were the same as those of Example 1. The following solution was applied onto the layer by spin coating under a nitrogen atmosphere at 2,000 rpm for 20 seconds, whereby an organic film (the light emitting layer 103) having a thickness of 120 nm was formed, and was dried in a vacuum chamber at 120° C. for 1 hour.

| | |
|---|---|
| Chlorobenzene: | 10 g |
| Polyvinyl carbazole (Exemplified Compound 5001: average molecular weight 9,600): | 92 mg |
| Nanoparticles identical to those of Example 1 (Exemplified Compound 2001): | 8 mg |

After that, the cathode 101 was formed in the same manner as in Example 1, and the resultant device was evaluated for device characteristics in the same manner as in Example 1.

The resultant EL light emission was green light emission (emission peak wavelength=530 nm), and its external emission quantum efficiency was 4.8%. This means that high efficiency was obtained. The maximum luminance of the EL light emission was 1,000 cd/cm$^2$. This means that high luminance was realized. In addition, at a luminance of 100 cd/cm$^2$, the EL light emission was stably good, and remained good even after energization for 10 hours.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-297374, filed Nov. 1, 2006, which is hereby incorporated by reference herein in its entirety.

What is claimed is:

1. An organic light emitting device comprising:
a pair of electrodes; and
a light emitting layer interposed between the electrodes,
wherein the light emitting layer comprises a host material and solid particles dispersed in the host material, the solid particles each having a particle diameter of 25 nm to 250 nm;
wherein the host material is polyvinyl carbazole; and wherein the solid particles are a phosphorescent metal complex represented by one of the following formulae
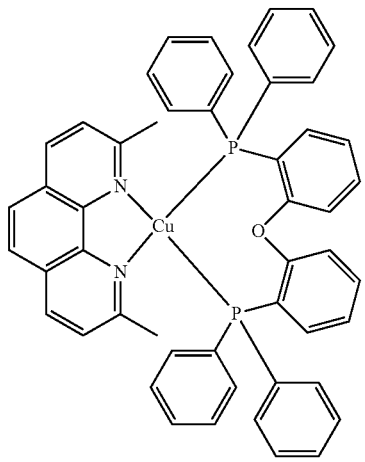
or
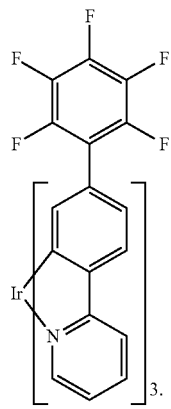
* * * * *